United States Patent
Lee et al.

(10) Patent No.: US 9,466,555 B2
(45) Date of Patent: Oct. 11, 2016

(54) SEMICONDUCTOR CHIP AND STACK TYPE SEMICONDUCTOR APPARATUS USING THE SAME

(71) Applicant: SK hynix Inc., Icheon-si Gyeonggi-do (KR)

(72) Inventors: Jae Seung Lee, Icheon-si (KR); Byung Kuk Yoon, Icheon-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/624,720

(22) Filed: Feb. 18, 2015

(65) Prior Publication Data
US 2016/0163619 A1   Jun. 9, 2016

(30) Foreign Application Priority Data

Dec. 5, 2014   (KR) .................. 10-2014-0174388

(51) Int. Cl.
*H01L 25/065*   (2006.01)
*H01L 23/48*   (2006.01)
*H01L 27/118*   (2006.01)

(52) U.S. Cl.
CPC ......... *H01L 23/481* (2013.01); *H01L 25/0657* (2013.01); *H01L 27/11898* (2013.01)

(58) Field of Classification Search
CPC ............. H01L 23/481; H01L 25/0657; H01L 27/11898
See application file for complete search history.

(56) References Cited

U.S. PATENT DOCUMENTS

| | | | | |
|---|---|---|---|---|
| 8,704,225 B2* | 4/2014 | Kim | ..................... | H01L 23/544 257/48 |
| 8,837,191 B2* | 9/2014 | Park | ..................... | G06F 13/20 365/198 |
| 9,165,624 B2* | 10/2015 | Byeon | ................. | G11C 29/022 |
| 9,252,129 B2* | 2/2016 | Yun | ..................... | H01L 25/0657 |
| 2012/0138927 A1* | 6/2012 | Kang | ............... | G01R 31/31851 257/48 |

FOREIGN PATENT DOCUMENTS

KR   1020150097074 A   8/2015

* cited by examiner

*Primary Examiner* — Jeffrey Zweizig
(74) *Attorney, Agent, or Firm* — William Park & Associates Ltd.

(57) ABSTRACT

A semiconductor may include a core block configured to store and output data, and may be configured to output internal information. The semiconductor may include a through via configured for signal transfer with another semiconductor chip. The semiconductor may include an internal information processing circuit configured to transmit internal information selected from the internal information to the through via, or may be configured to output internal information of the other semiconductor chip, which has been transmitted through the through via, to an exterior through a special purpose pin, in response to test signals.

18 Claims, 5 Drawing Sheets

SEMICONDUCTOR CHIP AND STACK TYPE SEMICONDUCTOR APPARATUS USING THE SAME

CROSS-REFERENCES TO RELATED APPLICATION

The present application claims priority under 35 U.S.C. §119(a) to Korean application number 10-2014-0174388, filed on Dec. 5, 2014, in the Korean Intellectual Property Office, which is incorporated herein by reference in its entirety as set forth in full.

BACKGROUND

1. Technical Field

Various embodiments generally relate to a semiconductor circuit, and more particularly, to a semiconductor chip and a stack type semiconductor apparatus using the same.

2. Related Art

A semiconductor apparatus, for example, a multi-chip package is a package chip including a plurality of chips. The multi-chip semiconductor apparatus are extensively used in mobile devices such as cellular phones because necessity memory may be combined other necessity memory according to various application products.

The multi-chip package may be configured using a three-dimensional stacking scheme. The three-dimensional stacking scheme utilizes a plurality of chips stacked in a vertical direction and are coupled to one another with the use of through vias.

In order to determine whether the multi-chip package is normally operating, it is necessary to monitor the internal information of each of the plurality of chips from a device exterior to the multi-chip package.

SUMMARY

In an embodiment, a semiconductor chip may include a core block configured to store and output data, and may be configured to output internal information. The semiconductor chip may include a through via configured for signal transfer with another semiconductor chip. The semiconductor chip may include an internal information processing circuit configured to transmit internal information selected from the internal information to the through via, or may be configured to output internal information of the other semiconductor chip, which has been transmitted through the through via, to an exterior through a special purpose pin, in response to test signals.

In an embodiment, a stack type semiconductor apparatus may include a plurality of stacked semiconductor chips. A special purpose pin may be configured to be coupled to any one of the plurality of semiconductor chips, and internal information of any one semiconductor chip selected from among the plurality of semiconductor chips may be configured to be outputted to an exterior through the special purpose pin.

DETAILED DESCRIPTION

Hereinafter, a semiconductor chip and a stack type semiconductor apparatus using the same according to various embodiments will be described with reference to the accompanying drawings through an various examples of embodiments.

A semiconductor chip capable of outputting internal information of a desired semiconductor chip among semiconductor chips stacked in a stack type semiconductor apparatus to an exterior through a separate pin, and a stack type semiconductor apparatus using the same may be described herein.

Figure 1:
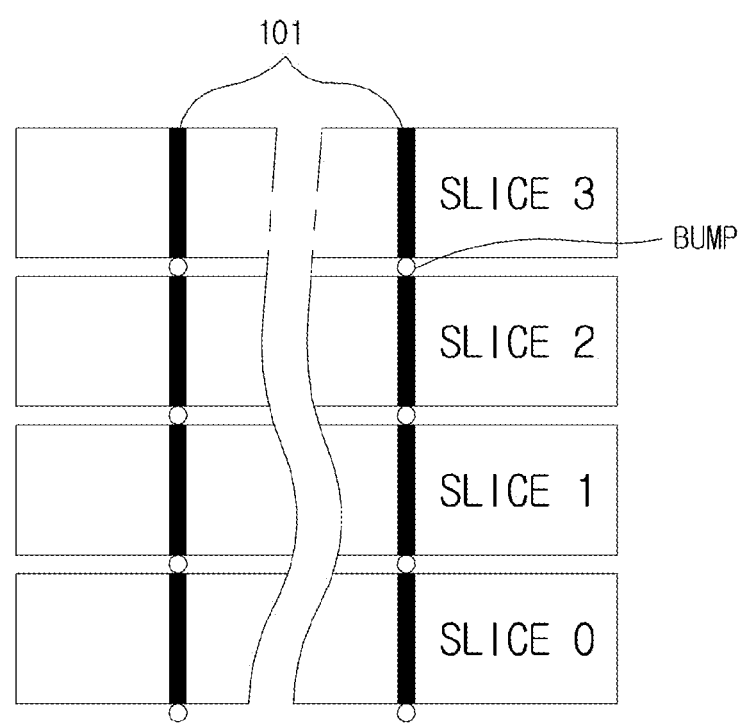
FIG. 1 is an example of a representation of a sectional view of a semiconductor apparatus 100 according to an embodiment.

Referring to FIG. 1, a semiconductor apparatus 100 according to an embodiment may include a plurality of semiconductor chips SLICE 0 to SLICE 3 stacked in a three-dimensional (3D) stacking scheme.

Among the plurality of semiconductor chips SLICE 0 to SLICE 3, the semiconductor chip SLICE 0 may serve as a master chip, and the other semiconductor chips SLICE 1 to SLICE 3 may serve as slave chips.

The plurality of stacked semiconductor chips SLICE 0 to SLICE 3 may be electrically coupled to one another. The plurality of stacked semiconductor chips SLICE 0 to SLICE 3 may be electrically connected or coupled to one another through a plurality of through vias 101, for example, through-silicon vias (TSVs).

The plurality of through vias 101 of the plurality of stacked semiconductor chips SLICE 0 to SLICE 3 may be coupled to one another through bumps.

Figure 2:
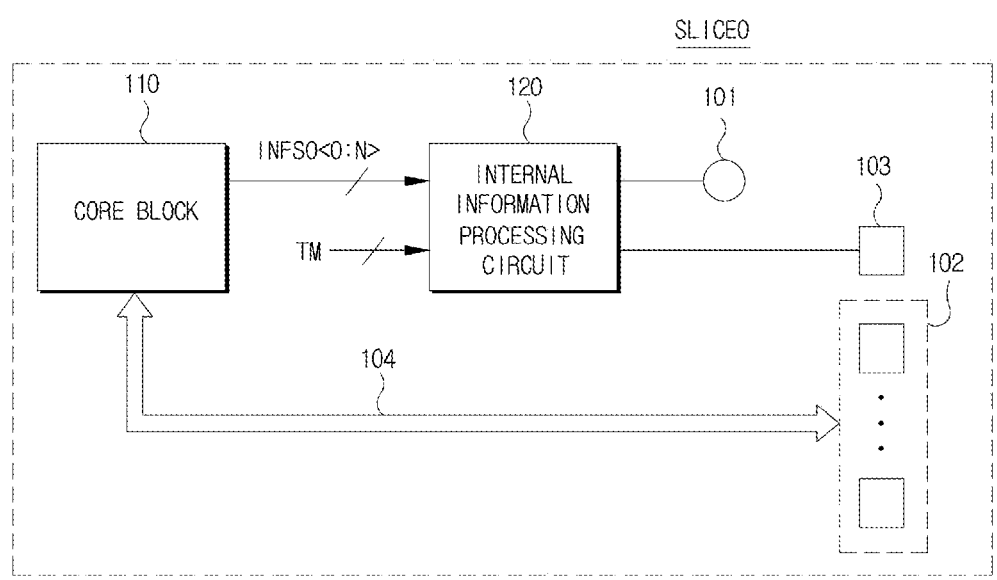
FIG. 2 is a block diagram illustrating an example of a representation of the internal configuration of a semiconductor chip SLICE 0 of FIG. 1.

Referring to FIG. 2, each of the plurality of semiconductor chips SLICE 0 to SLICE 3 may include a core block 110, an internal information processing circuit 120, and input/output pads 102. Each of the plurality of semiconductor chips SLICE 0 to SLICE 3 may include a special purpose pad 103. For example, semiconductor chip SLICE 0 is illustrated in FIG. 2 including the core block 110, the internal information processing circuit 120, the input/output pads 102, and the special purpose pad 103.

The core block 110 may include a memory block for storing and outputting data provided from an exterior of the semiconductor apparatus or semiconductor chip (i.e., SLICE 0).

Internal information INFS0<0:N> may include signals that may be internally used in the core block 110.

The internal information INFS0<0:N> may include signals that may not be outputted through external pins coupled to the input/output pads 102.

The signals, which may be outputted through the external pins coupled to the input/output pads 102, are internal signals passing through internal circuits according to an external command. For example, these signals may include internal read command-based signals and internal write command-based signals generated according to the external commands.

The core block 110 may include an interface circuit configured for inputting and outputting the data of the memory block.

The core block 110 may include an interface circuit configured for inputting and outputting signals with an external device, for example, a memory controller such as a CPU or a GPU or a tester.

The core block 110 may be coupled to the input/output pads 102 through an input/output bus 104.

The internal information processing circuit 120 may be coupled to the through vias 101 and the special purpose pad 103.

The input/output pads 102 may be configured for inputting and outputting the data of the memory block.

The special purpose pad 103 may be a pad configured to transmit a parity of a command/an address or an abnormal operation state of the semiconductor chip to an external device.

The internal information processing circuit 120 may be configured to transmit internal information selected from among internal information INFS0<0:N> to INFS3<0:N> (see FIG. 3) to the through vias 101 or to output internal information of another semiconductor chip, which has been transmitted through the through vias 101, to an exterior through the special purpose pad 103, in response to test signals TM.

Figure 3:
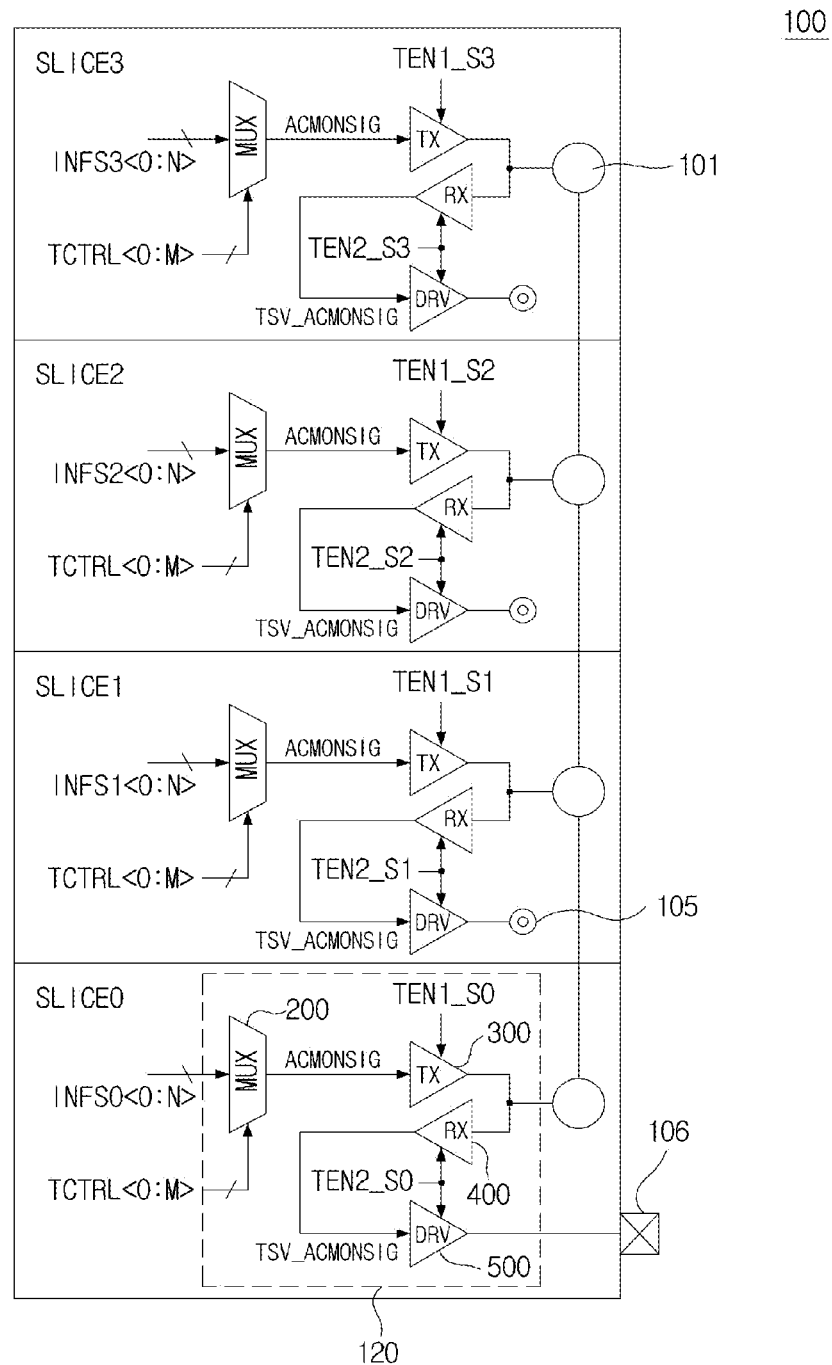
FIG. 3 is a block diagram illustrating an example of a representation of a semiconductor apparatus 100 according to an embodiment.

Referring to FIG. 3, in the semiconductor apparatus 100 according to an embodiment, each of the plurality of semiconductor chips SLICE 0 to SLICE 3 may include the internal information processing circuit 120.

After the semiconductor apparatus 100 is packaged, only the special purpose pad 103 of the semiconductor chip SLICE 0 serving as a master chip is coupled to an external pin 106 (hereinafter, referred to as a special purpose pin).

The input/output pads 102 described with reference to FIG. 2 are also coupled to external pins.

The special purpose pad 103 of each of the other semiconductor chips SLICE 1 to SLICE 3 may be processed as a floating node 105.

The internal information processing circuit 120 may include a multiplexer (MUX) 200, a transmitter (TX) 300, and a receiver (RX) 400. The internal information processing circuit 120 may include a driver (DRV) 500.

The internal information processing circuit 120 may use, as the test signals TM, a first test signal set TCTRL<0:M>, a second test signal set TEN1_S<0:3>, and a third test signal set TEN2_S<0:3>.

The first test signal set TCTRL<0:M> may be shared by the plurality of semiconductor chips SLICE 0 to SLICE 3.

The second test signal set TEN1_S<0:3> may be assigned to the plurality of semiconductor chips SLICE 0 to SLICE 3 one by one or respectively.

The third test signal set TEN2_S<0:3> may be assigned to the plurality of semiconductor chips SLICE 0 to SLICE 3 one by one or respectively.

The configuration of the internal information processing circuit 120 of the semiconductor chip SLICE 0 will be described below as an example.

The multiplexer 200 may be configured to select one of the internal information INFS0<0:N> and generate an output signal ACMONSIG according to the first test signal set TCTRL<0:M>.

An input terminal of the multiplexer 200 may be coupled to the internal circuit configurations of the core block 110 of FIG. 2 through which the internal information INFS0<0:N> is generated or passes.

The transmitter 300 may be configured to activate according to the second test signal TEN1_S0 of the second test signal set TEN1_S<0:3>, which has been assigned to the transmitter 300, and to transmit the output signal ACMONSIG of the multiplexer 200 to the through vias 101.

The receiver 400 may be configured to activate according to the third test signal TEN2_S0 of the third test signal set TEN2_S<0:3>, which has been assigned to the receiver 400, to receive internal information of another semiconductor chip transmitted through the through via 101, and to generate an output signal TSV_ACMONSIG.

The driver 500 may be configured to activate according to the third test signal TEN2_S0 and to output the output signal TSV_ACMONSIG of the receiver 400 through the special purpose pin 106.

The internal information output method of the semiconductor apparatus 100 configured as above according to an embodiment will be described below with reference to FIG. 4.

For example, a description will be provided for a method for outputting one of the internal information INFS2<0:N> of the semiconductor chip SLICE 2 to an exterior of the semiconductor apparatus 100 through the special purpose pin 106.

An external device of the semiconductor apparatus 100, for example, a tester provides the semiconductor apparatus 100 with the first test signal set TCTRL<0:M> for selecting one of the internal information INFS2<0:N> of the semiconductor chip SLICE 2.

The tester provides the semiconductor apparatus 100 with the first test signal set TCTRL<0:M> and simultaneously or substantially simultaneously activates the second test signal TEN1_S2 of the second test signal set TEN1_S<0:3> and the third test signal TEN2_S0 of the third test signal set TEN2_S<0:3>.

Figure 4:
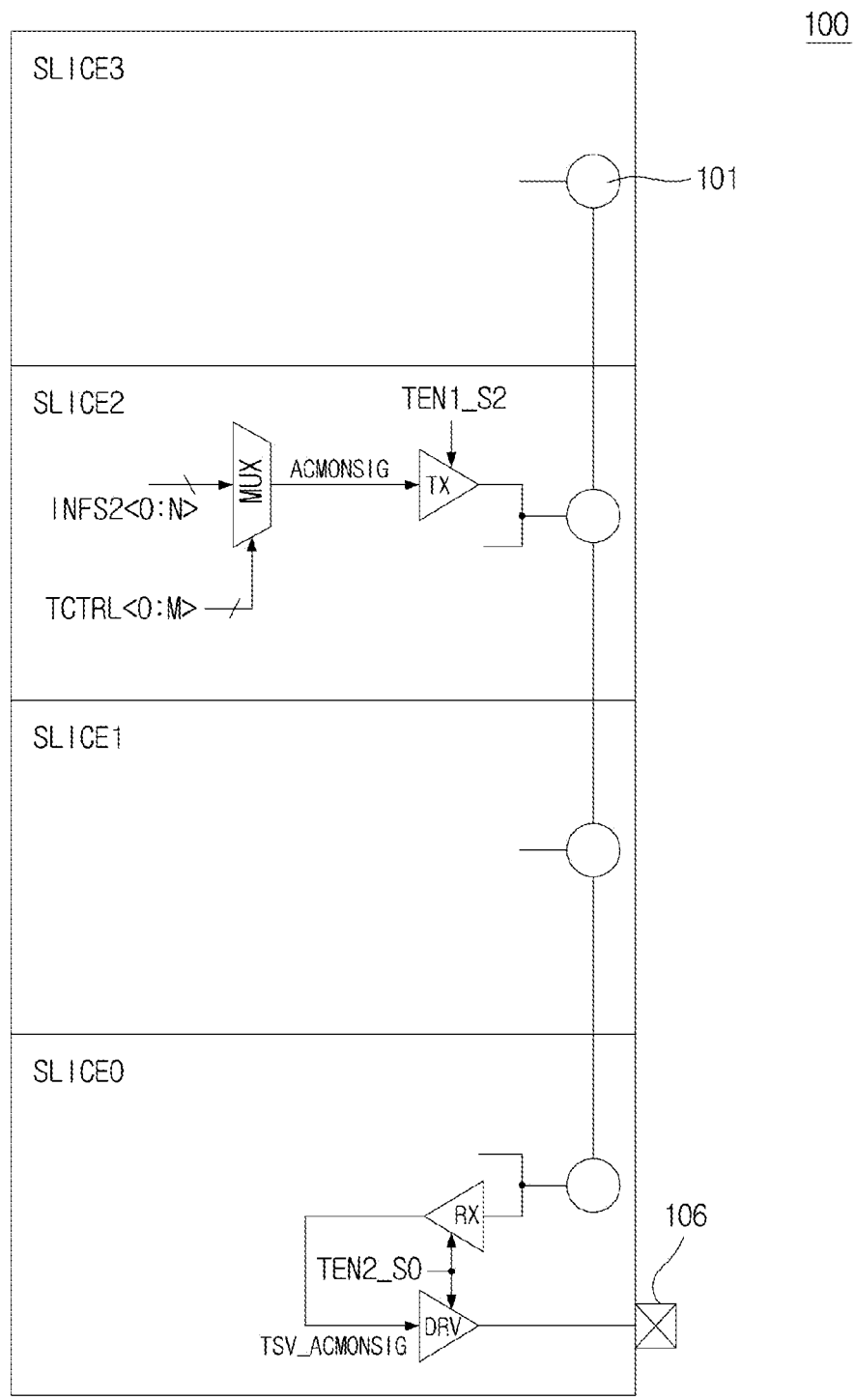
FIG. 4 is a block diagram example of a representation for explaining an internal information processing operation of a semiconductor apparatus 100 according to an embodiment.

FIG. 4 illustrates only an activated circuit configuration when the second test signal TEN1_S2 and the third test signal TEN2_S0 are activated in the semiconductor apparatus 100.

Since the second test signal TEN1_S2 and the third test signal TEN2_S0 have been activated, the multiplexer MUX and the transmitter TX of the semiconductor chip SLICE 2 and the receiver RX and the driver DRV of the semiconductor chip SLICE 0 are activated, and the other circuit configurations, except for these configurations, are deactivated as illustrated in FIG. 4.

The multiplexer MUX of the semiconductor chip SLICE 2 selects one of the internal information INFS2<0:N> and generates the signal ACMONSIG according to the first test signal set TCTRL<0: M>.

The transmitter TX of the semiconductor chip SLICE 2 transmits the signal ACMONSIG to the through via 101.

The signal ACMONSIG is transmitted to all the semiconductor chips SLICE 3, SLICE 1, and SLICE 2 through the through vias 101.

As the second test signal TEN1_S2 and the third test signal TEN2_S0 are activated, only the multiplexer MUX and the transmitter TX of the semiconductor chip SLICE 2 and only the receiver RX and the driver DRV of the semiconductor chip SLICE 0 are in the activated state.

Accordingly, the output signal ACMONSIG of the semiconductor chip SLICE 2 is inputted to the receiver RX of the semiconductor chip SLICE 0 through the through via 101.

The receiver RX of the semiconductor chip SLICE 0 receives the signal ACMONSIG transmitted through the through via 101, and generates the signal TSV_ACMONSIG.

The driver DRV of the semiconductor chip SLICE 0 outputs the signal TSV_ACMONSIG to an exterior of the semiconductor apparatus 100 through the special purpose pin 106.

The tester outside the semiconductor apparatus 100 is able to monitor the signal TSV_ACMONSIG through the special purpose pin 106, and to test whether the semiconductor chip SLICE 2 is normally operating.

In the example of monitoring the internal information of the semiconductor chip SLICE 3, the tester provides the semiconductor apparatus 100 with the first test signal set TCTRL<0:M> and simultaneously activates the second test signal TEN1_S3 of the second test signal set TEN1_S<0:3> and the third test signal TEN2_S0 of the third test signal set TEN2_S<0:3>.

In the example of monitoring the internal information of the semiconductor chip SLICE 1, the tester provides the semiconductor apparatus 100 with the first test signal set TCTRL<0:M> and simultaneously activates the second test signal TEN1_S1 of the second test signal set TEN1_S<0:3> and the third test signal TEN2_S0 of the third test signal set TEN2_S<0:3>.

In the example of monitoring the internal information of the semiconductor chip SLICE 0, the tester provides the semiconductor apparatus 100 with the first test signal set TCTRL<0:M> and simultaneously activates the second test signal TEN1_S0 of the second test signal set TEN1_S<0:3> and the third test signal TEN2_S0 of the third test signal set TEN2_S<0:3>.

According to an embodiment, the internal information of a desired one of the plurality of semiconductor chips SLICE 0 to SLICE 3 may be provided to an exterior of the semiconductor apparatus 100 by the aforementioned scheme.

Figure 5:
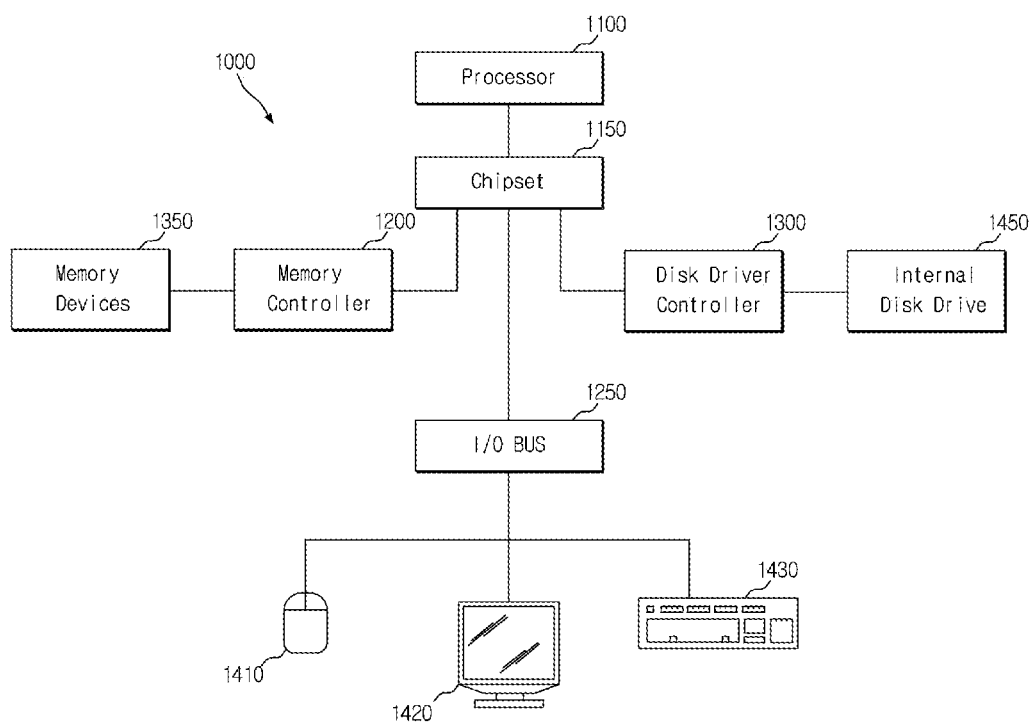
FIG. 5 illustrates a block diagram of an example of a representation of a system employing the semiconductor chip and/or stack type semiconductor apparatus in accordance with the embodiments discussed above with relation to FIGS. 1-4.

The semiconductor chip and/or stack type semiconductor apparatus discussed above (see FIGS. 1-4) are particular useful in the design of memory devices, processors, and computer systems. For example, referring to FIG. 5, a block diagram of a system employing the internal voltage generation circuit in accordance with the embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one semiconductor chip and/or stack type semiconductor apparatus as discussed above with reference to FIGS. 1-4. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor chip and/or stack type semiconductor apparatus as discussed above with relation to FIGS. 1-4, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 5 is merely one example of a system employing the semiconductor chip and/or stack type semiconductor apparatus as discussed above with relation to FIGS. 1-4. In alternate embodiments, such as cellular phones or digital cameras, the components may differ from the embodiments illustrated in FIG. 5.

While various embodiments have been described above, it will be understood to those skilled in the art that the embodiments described are by way of example only. Accordingly, the semiconductor chip and the stack type semiconductor apparatus using the same described herein should not be limited based on the described embodiments. Rather, the semiconductor chip and the stack type semiconductor apparatus using the same described herein should only be limited in light of the claims that follow when taken in conjunction with the above description and accompanying drawings.

What is claimed is:

1. A semiconductor chip comprising:
   a core block configured to store and output data, and configured to output internal information;
   a through via configured for signal transfer with another semiconductor chip;
   an internal information processing circuit configured to transmit internal information selected from the internal information to the through via, or configured to output internal information of the other semiconductor chip transmitted through the through via, to an exterior through a special purpose pin, in response to test signals; and
   input/output pads configured for inputting and outputting data between the core block and an exterior of the semiconductor chip.

2. The semiconductor chip according to claim 1, wherein the special purpose pin is configured to provide a parity of a command, an address, or an abnormal operation state of the semiconductor chip exterior to the semiconductor chip and other semiconductor chip.

3. The semiconductor chip according to claim 1, wherein the internal information is used in the semiconductor chip, and includes signals which cannot be outputted through the input/output pads of the semiconductor chip.

4. The semiconductor chip according to claim 1, wherein the internal information that is outputted through the input/output pads of the semiconductor chip are internal signals passing through internal circuits according to an external command.

5. The semiconductor chip according to claim 4, wherein the internal information includes read command-based signal and write command-based signals.

6. The semiconductor chip according to claim 1, wherein the internal information processing circuit comprises:
 a multiplexer configured to select and output one of the internal information according to a first test signal of the test signals;
 a transmitter configured to be activated according to a second test signal of the test signals and to transmit an output signal of the multiplexer to the through via;
 a receiver configured to be activated according to a third test signal of the test signals and to receive and output the internal information of the other semiconductor chip transmitted through the through via; and
 a driver configured to be activated according to the third test signal, and to output an output signal of the receiver through the special purpose pin.

7. The semiconductor chip according to claim 6,
 wherein an input terminal of the multiplexer is coupled to internal circuit configurations of the core block,
 wherein the internal information is used in the internal circuit configurations of the core block.

8. The semiconductor chip according to claim 1, wherein the semiconductor chip is a master chip and the another semiconductor chip is a slave chip and are coupled to each other by trough-silicon vias.

9. A stack type semiconductor apparatus comprising:
 a plurality of stacked semiconductor chips,
 wherein a special purpose pin is coupled to any one of the plurality of semiconductor chips, and internal information of any one semiconductor chip selected from among the plurality of semiconductor chips is outputted to an exterior through the special purpose pin,
 wherein one or more of the plurality of semiconductor chips comprises:
 input/output pads configured for inputting and outputting data to and from an exterior of the semiconductor apparatus.

10. The stack type semiconductor apparatus according to claim 9, wherein the plurality of semiconductor chips are configured to transmit a signal through a through via, the internal information of the selected semiconductor chip is transmitted to the through via, and the semiconductor chip coupled to the special purpose pin outputs the internal information received through the through via to an exterior of the semiconductor apparatus through the special purpose pin.

11. The stack type semiconductor apparatus according to claim 9, wherein the semiconductor chip coupled to the special purpose pin is a master chip and semiconductor chips, except for the semiconductor chip coupled to the special purpose pin, are slave chips.

12. The stack type semiconductor apparatus according to claim 9, wherein the special purpose pin is configured to provide a parity of a command, an address, or an abnormal operation state of the semiconductor chip exterior to the semiconductor apparatus.

13. The stack type semiconductor apparatus according to claim 9, wherein the internal information represents signals used in each of the plurality of semiconductor chips, and includes signals which cannot be outputted through the input/output pads of the semiconductor chip.

14. The stack type semiconductor apparatus according to claim 9, wherein the internal information that is outputted through the input/output pads of the semiconductor chip are internal signals passing through internal circuits according to an external command.

15. The stack type semiconductor apparatus according to claim 14, wherein the internal information includes read command-based signal and write command-based signals.

16. The stack type semiconductor apparatus according to claim 9, wherein each of the plurality of semiconductor chips comprises:
 a core block configured to store and output data, and configured to output internal information;
 a through via configured for signal transfer with another semiconductor chip; and
 an internal information processing circuit configured to transmit the internal information to the through via, or configured to output internal information of the other semiconductor chip, which has been transmitted through the through via, to an exterior through the special purpose pin, in response to test signals.

17. The stack type semiconductor apparatus according to claim 16, wherein the internal information processing circuit comprises:
 a multiplexer configured to select and output one of the internal information according to a first test signal of the test signals;
 a transmitter configured to be activated according to a second test signal of the test signals and to transmit an output signal of the multiplexer to the through via;
 a receiver configured to be activated according to a third test signal of the test signals and to receive and output the internal information of the other semiconductor chip, which has been transmitted through the through via; and
 a driver configured to be activated according to the third test signal, and to output an output signal of the receiver through the special purpose pin.

18. The stack type semiconductor apparatus according to claim 17,
 wherein an input terminal of the multiplexer is coupled to internal circuit configurations of the core block,
 wherein the internal information is used in the internal circuit configurations of the core block.

* * * * *